(12) United States Patent
Chandrasekaran et al.

(10) Patent No.: US 7,381,647 B2
(45) Date of Patent: *Jun. 3, 2008

(54) METHODS AND SYSTEMS FOR PLANARIZING MICROELECTRONIC DEVICES WITH GE-SE-AG LAYERS

(75) Inventors: Nagasubramaniyan Chandrasekaran, Boise, ID (US); Theodore M. Taylor, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 35 days.

This patent is subject to a terminal disclaimer.

(21) Appl. No.: 11/112,787

(22) Filed: Apr. 21, 2005

(65) Prior Publication Data

US 2005/0205523 A1   Sep. 22, 2005

Related U.S. Application Data

(63) Continuation of application No. 10/222,238, filed on Aug. 16, 2002, now Pat. No. 6,884,144.

(51) Int. Cl.
*H01L 21/461* (2006.01)

(52) U.S. Cl. ............ 438/690; 438/692; 438/693; 216/88; 216/89; 451/65

(58) Field of Classification Search ......... 438/690, 438/693, 692; 451/65; 216/88, 89
See application file for complete search history.

(56) References Cited

U.S. PATENT DOCUMENTS

| | | |
|---|---|---|
| 5,761,115 A | 6/1998 | Kozicki et al. |
| 5,789,277 A | 8/1998 | Zahorik et al. |
| 5,879,226 A | 3/1999 | Robinson |
| 5,914,893 A | 6/1999 | Kozicki et al. |
| 6,017,659 A * | 1/2000 | Lee et al. ............ 430/5 |

(Continued)

FOREIGN PATENT DOCUMENTS

| | | |
|---|---|---|
| WO | WO 98/59365 | 12/1998 |
| WO | WO 00/13218 | 3/2000 |
| WO | WO 01/74958 A2 | 10/2001 |
| WO | WO 02/18099 A2 | 3/2002 |

OTHER PUBLICATIONS

Tarey, R.D., et al., The Rigaku Journal, "Characterization of Thin Films by Glancing Incidence X-Ray Diffraction," vol. 4, No. 1/2, 1987, pp. 11-15.
Ovonyx Technology, "Ovonic Unified Memory," http://www.ovonyx.com/tech_html.ht, May 22, 2002, 2 pages.

*Primary Examiner*—Binh X. Tran
(74) *Attorney, Agent, or Firm*—Perkins Coie LLP

(57) ABSTRACT

Microelectronic devices including a layer of germanium and selenium, optionally including up to 10 atomic percent silver, show promise for select applications. Manufacturing microelectronic devices containing such layers using conventional CMP processes presents some significant challenges. Embodiments of the invention provide methods of planarizing workpieces with Ge—Se layers, many of which can be carried out using conventional CMP equipment. Other embodiments of the invention provide chemical-mechanical polishing systems adapted to produce planarized workpieces with Ge—Se layers or, in at least one embodiment, other alternative layers. Various approaches suggested herein facilitate production of such microelectronic devices by appropriate control of the down force of the Ge—Se layer against the planarizing medium and/or one or more aspects of the planarizing medium, which aspects include pH, abrasive particle size, abrasive particle hardness, weight percent of abrasive.

37 Claims, 2 Drawing Sheets

U.S. PATENT DOCUMENTS

| | | |
|---|---|---|
| 6,033,766 A | 3/2000 | Block et al. |
| 6,084,796 A | 7/2000 | Kozicki et al. |
| 6,238,270 B1 | 5/2001 | Robinson |
| 6,284,643 B1 | 9/2001 | Reinberg |
| 6,287,919 B1 | 9/2001 | Zahorik |
| 6,322,600 B1 * | 11/2001 | Brewer et al. ............... 51/308 |
| 6,348,365 B1 | 2/2002 | Moore et al. |
| 6,527,818 B2 | 3/2003 | Hattori et al. |
| 6,736,698 B2 | 5/2004 | Moore |
| 6,811,474 B2 | 11/2004 | Cherian et al. |
| 6,884,144 B2 * | 4/2005 | Chandrasekaran et al. ..... 451/5 |
| 2002/0019202 A1 * | 2/2002 | Thomas et al. ............... 451/57 |
| 2002/0119654 A1 * | 8/2002 | Fornof et al. ............... 438/638 |
| 2003/0013387 A1 * | 1/2003 | Tsai et al. .................... 451/41 |
| 2003/0036339 A1 * | 2/2003 | Bonner et al. ............... 451/41 |

* cited by examiner

US 7,381,647 B2

METHODS AND SYSTEMS FOR PLANARIZING MICROELECTRONIC DEVICES WITH GE-SE-AG LAYERS

CROSS-REFERENCE TO RELATED APPLICATION

This application is a continuation of U.S. application Ser. No. 10/222,238, entitled "METHODS AND SYSTEMS FOR PLANARIZING MICROELECTRONIC DEVICES WITH Ge—Se—Ag LAYERS" filed Aug. 16, 2002, now U.S. Pat. No. 6,884,144, which is incorporated herein by reference in its entirety.

TECHNICAL FIELD

The present invention provides certain improvements in processing microelectronic devices. The invention has particular utility in connection with planarizing microelectronic devices with Ge—Se—Ag layers.

BACKGROUND

Mechanical and chemical-mechanical planarizing processes (collectively "CMP") remove material from the surface of semiconductor wafers, field emission displays or other microelectronic workpieces in the production of microelectronic devices and other products. FIG. 1 schematically illustrates a CMP machine 10 with a platen 20, a carrier assembly 30, and a planarizing pad 40. The CMP machine 10 may also have an under-pad 25 attached to an upper surface 22 of the platen 20 and the lower surface of the planarizing pad 40. A drive assembly 26 rotates the platen 20 (indicated by arrow F), or it reciprocates the platen 20 back and forth (indicated by arrow G). Since the planarizing pad 40 is attached to the under-pad 25, the planarizing pad 40 moves with the platen 20 during planarization.

The carrier assembly 30 has a head 32 to which a microelectronic workpiece 12 may be attached, or the microelectronic workpiece 12 may be attached to a resilient pad 34 in the head 32. The head 32 may be a free-floating wafer carrier, or an actuator assembly 36 may be coupled to the head 32 to impart axial and/or rotational motion to the workpiece 12 (indicated by arrows H and I, respectively).

The planarizing pad 40 and a planarizing solution 44 on the pad 40 collectively define a planarizing medium that mechanically and/or chemically removes material from the surface of the workpiece 12. The planarizing pad 40 can be a soft pad or a hard pad. The planarizing pad 40 can also be a fixed-abrasive planarizing pad in which abrasive particles are fixedly bonded to a suspension material. In fixed-abrasive applications, the planarizing solution 44 is typically a non-abrasive "clean solution" without abrasive particles. In other applications, the planarizing pad 40 can be a non-abrasive pad composed of a polymeric material (e.g., polyurethane), resin, felt or other suitable materials. The planarizing solutions 44 used with the non-abrasive planarizing pads are typically abrasive slurries with abrasive particles suspended in a liquid. The planarizing solution may be replenished from a planarizing solution supply 46.

If chemical-mechanical planarization (as opposed to plain mechanical planarization) is employed, the planarizing solution 44 will typically chemically interact with the surface of the workpiece 12 to speed up or otherwise optimize the removal of material from the surface of the workpiece. Increasingly, microelectronic device circuitry (i.e., trenches, vias, and the like) is being formed from copper. When planarizing a copper layer using CMP, the planarizing solution 44 is typically neutral to acidic and includes an oxidizer (e.g., hydrogen peroxide) to oxidize the copper and increase the copper removal rate. One particular slurry useful for polishing a copper layer is disclosed in International Publication Number WO 02/18099, the entirety of which is incorporated herein by reference.

To planarize the workpiece 12 with the CMP machine 10, the carrier assembly 30 presses the workpiece 12 face-downward against the polishing medium. More specifically, the carrier assembly 30 generally presses the workpiece 12 against the planarizing solution 44 on a planarizing surface 42 of the planarizing pad 40, and the platen 20 and/or the carrier assembly 30 move to rub the workpiece 12 against the planarizing surface 42. As the workpiece 12 rubs against the planarizing surface 42, material is removed from the face of the workpiece 12.

CMP processes should consistently and accurately produce a uniformly planar surface on the workpiece to enable precise fabrication of circuits and photo-patterns. During the construction of transistors, contacts, interconnects and other features, many workpieces develop large "step heights" that create highly topographic surfaces. Such highly topographical surfaces can impair the accuracy of subsequent photolithographic procedures and other processes that are necessary for forming sub-micron features. For example, it is difficult to accurately focus photo patterns to meet tolerances approaching 0.1 micron on topographic surfaces because sub-micron photolithographic equipment generally has a very limited depth of field. Thus, CMP processes are often used to transform a topographical surface into a highly uniform, planar surface at various stages of manufacturing microelectronic devices on a workpiece.

Chalcogenide materials can be used as electrically writable and erasable phase change materials, i.e., they can be electrically switched between generally amorphous and generally crystalline states with different resistive properties, or between different resistive states while in crystalline form. Such electrically writable and erasable materials are useful in a number of applications, including non-volatile or "state-changeable" memory devices such as EEPROMs and FLASH memory devices. Chalcogenide alloys have also garnered much attention as possible elements of optical memory devices. Certain aspects of manufacturing devices including chalcogenide materials are disclosed in U.S. Pat. No. 5,789,277 (Zahorik et al.), the entirety of which is incorporated herein by reference. Germanium-tellurium (Ge—Te) and germanium-tellurium-antimony (Ge—Te—Sb) are, perhaps, the most common chalcogenide-metal alloys in current EEPROM and Flash applications. Increasingly, though, memory device manufacturers are investigating other chalcogenides as possible candidates for both electrically writable and erasable materials and optical memory applications.

SUMMARY

Various embodiments of the present dimension provide methods of planarizing workpieces with germanium-selenium layers or chemical-mechanical polishing systems adapted to produce planarized workpieces, e.g., workpieces with germanium-selenium layers. One exemplary embodiment provides a method of planarizing a microelectronic workpiece which includes a substrate having a surface, an outer layer defining a polished face of the workpiece, and an intermediate layer disposed between the substrate surface and the outer layer. This outer layer may comprise ($Ge_x$ $Se_y)_aAg_b$, wherein x is about 20-80, y is about 20-80, a is about 90-100, and b is about 0-10. In accordance with this method, a planarizing solution is delivered to a planarizing surface of the planarizing pad. The planarizing solution and the planarizing pad together comprise a planarizing medium. The planarizing solution has a pH of at least 7; in one embodiment, the pH is greater than 7. The planarizing medium includes abrasive articles having a mean particle size of no greater than about 100 nm. Material of the outer layer is removed by pressing the unpolished face of the workpiece against the polishing medium with a down force of no greater than about 4 psi. One useful application employs a down force of no greater than about 2 psi.

In one more specific adaptation of this embodiment, the planarizing solution includes a fluid component having a pH of about 8-11.5. The planarizing medium includes an abrasive comprising abrasive particles having a mean particle size of about 30-100 nm and a Vickers hardness number of less than about 1500. Material of the outer layer is removed by pressing the unpolished face of the workpiece against the polishing medium with a down force of at least about 0.1 psi and no more than about 2 psi.

One alternative embodiment provides a method of planarizing a microelectronic workpiece which includes a substrate and an outer layer comprising germanium and selenium. The outer layer optionally includes silver, as well. The microelectronic workpiece is loaded into a carrier assembly of a CMP machine. A planarizing solution is delivered to a planarizing pad. The planarizing solution and planarizing pad comprise a planarizing medium. The planarizing solution includes a fluid component having a pH of about 8-11.5 and a solid component comprising abrasive particles. Material of the outer layer is removed from the workpiece by rubbing the outer layer against the planarizing medium with a controlled force. In one embodiment, the material of the outer layer is removed by rubbing without substantial delamination of the outer layer. In another embodiment, the controlled force is about 0.1-2 psi.

A different embodiment of the invention provides a chemical-mechanical polishing system. This system may include a carrier assembly including an actuator, a planarizing medium, a workpiece, and a controller operatively coupled to the actuator. The planarizing medium, which may comprise a planarizing solution and a planarizing pad, includes an abrasive comprising abrasive particles having a mean particle size of about 30-100 nm and a Vickers hardness number of less than about 1500. The planarizing solution may comprise a fluid component having a pH of at least about 7, and preferably at least about 8, e.g., about 8-11.5. The workpiece, which is loaded into the carrier assembly, has an outer layer comprising germanium and selenium which is oriented toward the planarizing medium. The controller controls the actuator to control a down force of the outer layer against the polishing medium to a range of about 0.1-2 psi.

Still another embodiment provides an alternative chemical-mechanical polishing system that is well suited for use with a Ge—Se layer, but may be used to planarize other films, too. This system includes a carrier assembly including an actuator. The carrier assembly is adapted to hold the workpiece with an outer layer facing downwardly. A planarizing medium comprises a planarizing solution and a planarizing pad. The planarizing medium includes an abrasive comprising abrasive particles having a mean particle size of about 30-100 nm and a Vickers hardness number of less than about 1500. The planarizing solution comprises a fluid component having a pH of about 7-11.5, e.g., about 8-11.5. A controller, which may be operatively coupled to the actuator, controls the actuator to control a down force of the outer layer of the workpiece against the polishing medium to a range of about 0.1-2 psi.

DETAILED DESCRIPTION

Figure 1:
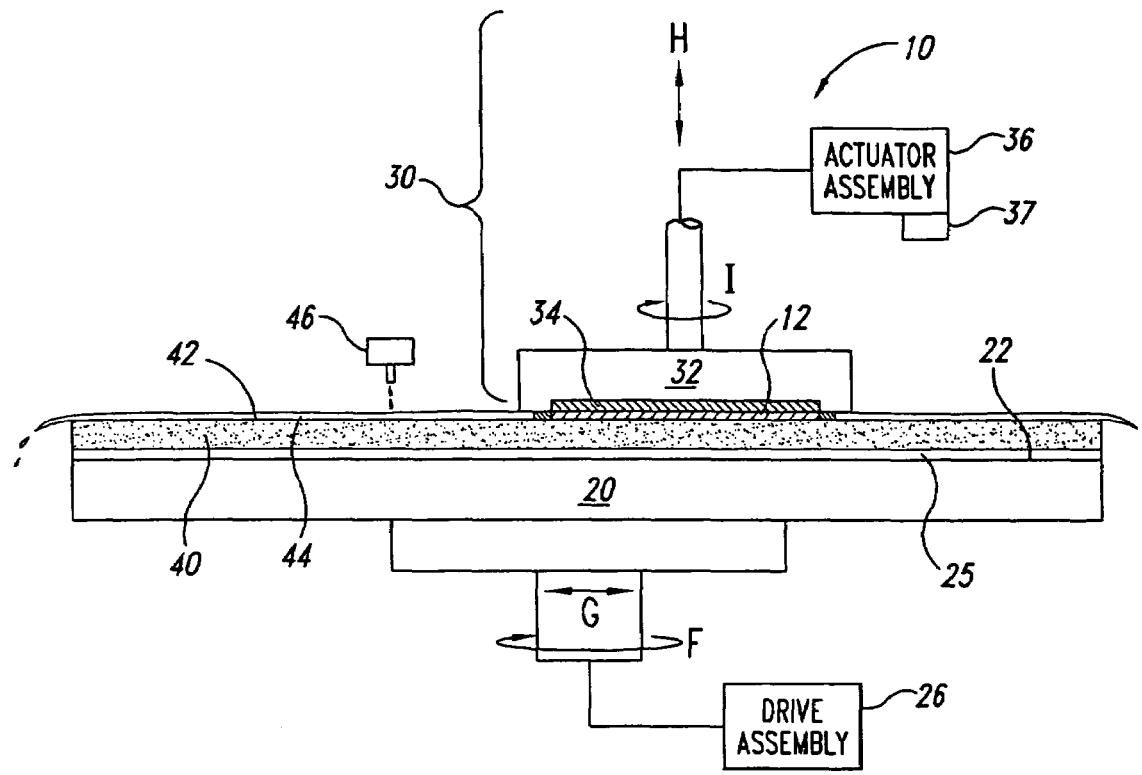
FIG. 1 is a schematic cross-sectional view of a planarizing machine in accordance with the prior art.

Various embodiments of the present invention provide methods and apparatus for processing microelectronic devices with Ge—Se—Ag layers. The following description provides specific details of certain embodiments of the invention illustrated in the drawings to provide a thorough understanding of those embodiments. It should be recognized, however, that the present invention can be reflected in additional embodiments and the invention may be practiced without some of the details in the following description.

The owner of the present invention is investigating thin films or structures comprising germanium and selenium, or germanium, selenium, and silver (collectively referred to below as Ge—Se—Ag chalcogenides or Ge—Se—Ag films, even though some of these films may not include any silver) in forming functional elements of select microelectronic devices, e.g., in non-volatile memory applications. Materials currently contemplated for such applications have the general formula $(Ge_xSe_y)_aAg_b$, wherein x is about 20-80, y is about 20-80, a is about 90-100, and b is about 0-10. It should be appreciated, however, that in some embodiments the values of x, y, a, and b are not limited to these ranges.

Figure 2:
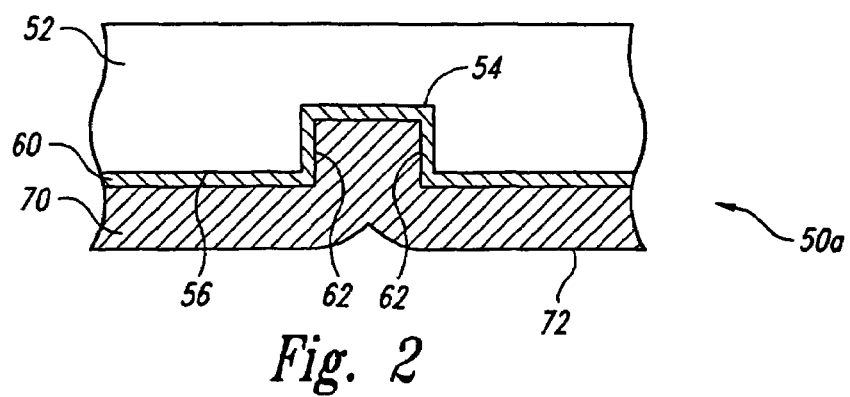
FIG. 2 is a schematic cross-sectional view of a portion of a microelectronic workpiece.

FIG. 2 schematically illustrates one possible structure of a microelectronic workpiece 50 employing a Ge—Se—Ag film. In this embodiment, the microelectronic workpiece 50 includes a substrate 52 having at least one recess 54 formed therein. The structure can be helpful in forming specific Ge—Se—Ag structures, e.g., conductive lines or vias of electronic circuitry, or electrically isolated lines, rings, or serpentine structures.

A Ge—Se—Ag film may comprise an outer layer 70 of the workpiece 50. This outer layer 70 may substantially fill the recess 54 and extend over the entire outer surface 56 of the substrate 52, or at least a working portion of the substrate 52. The Ge—Se—Ag chalcogenide may be deposited in any suitable fashion, e.g., using electrolytic deposition, chemical vapor deposition (CVD), physical vapor deposition (PVD), or atomic layer deposition (ALD). At this stage, the outer layer 70 is contiguous across the outer surface 56 of the substrate. If specific shapes or islands of Ge—Se—Ag chalcogenide are to be formed, an overburden of the outer layer 70 extending outwardly beyond the upper edge of the recess 54 will be removed, leaving the Ge—Se—Ag chalcogenide only in the filled recesses 54. In other embodiments, it may be desirable to form a thin, monolithic, contiguous Ge—Se—Ag film. However, the outer, unpolished face 72 of the outer layer 70 may have an irregular, topographic surface. As noted above, such topographic surfaces may be unsuitable for further processing steps, e.g., photolithographic procedures, and it may be advisable to planarize this surface before such further processing.

In the structure illustrated in FIG. 2, the microelectronic workpiece 50 includes an intermediate layer 60 disposed between the outer surface 56 of the substrate 52 and the outer layer 70. In the illustrated embodiment, the intermediate layer 60 extends over the entire outer surface 56 of the substrate 52, including the interior surface of the recess 54. In other embodiments, the intermediate layer 60 may be applied before the recess 54 is formed and the interior surface of the recess 54 will not include the intermediate layer 60. Such an intermediate layer 60 can be used for a variety of purposes. For example, the intermediate layer 60 may function as a diffusion barrier, limiting diffusion of the material of the outer layer 70 into the substrate 52 and vice versa. In other embodiments, the intermediate layer 60 may function merely as a polish stop, as discussed in more detail below. The composition and thickness of the intermediate layer 60 will depend on a number of factors, including the function of the intermediate layer (e.g., as a diffusion barrier or as a polish stop). Suitable materials for the intermediate layer 60 include tungsten, tantalum, platinum, silica, and silicon nitride. An intermediate layer comprising silicon nitride has functioned effectively as a polish stop layer, as described below.

CMP is commonly employed to planarize microelectronic workpieces having layers of copper or aluminum at commercially useful throughputs. As noted above, copper CMP operations typically employ neutral to acidic solutions. For example, International Publication Number WO 02/18099 (incorporated by reference above) suggests a copper planarizing slurry having a pH of about 2-6.

Ge—Se—Ag films, however, cannot be effectively and safely manufactured under such conditions. The presence of selenium in the Ge—Se—Ag films presents some chemical handling difficulties, in part because selenium hydride is highly toxic. Planarizing Ge—Se—Ag films can generate selenium hydride as a toxic fume. If selenium is allowed to oxidize, the oxide is more readily converted to the hydride, increasing the risk of producing a toxic gas during planarization. When manufacturing limited quantities of microelectronic devices employing Ge—Se chalcogenides for research purposes, these films can be planarized in a highly ventilated area, such as a hood. This is not practical in mass production on a commercial scale using conventional CMP apparatus and techniques. Although a basic solution can help limit the generation of toxic byproducts, it has been discovered that Ge—Se—Ag films can also dissolve in strongly basic solutions, which may make it difficult to control the polishing rate.

Silver also tends to be relatively mobile in Ge—Se—Ag films. Under CMP conditions commonly employed in planarizing copper films, for example, silver may tend to come out of solution and migrate to the surface during planarization and agglomerate on the surface. This leads to films with non-homogenous compositions and surface characteristics that vary from one location to another across the workpiece.

Another concern in planarizing Ge—Se—Ag films is that such films may delaminate from the workpiece during a planarizing cycle. In some applications, Ge—Se—Ag films may be applied over a layer of tungsten, tantalum, platinum, silica, or silicon nitride. Unfortunately, adhesion of these Ge—Se—Ag films to such underlayers is relatively poor. Conventional CMP processing techniques and conditions could cause Ge—Se—Ag films to delaminate from the underlying substrate, leading to faulty electrical connections and defective products.

It also can be difficult to predict and carefully control the polish rate of Ge—Se—Ag films, i.e., the rate at which the films are removed. This is due, at least in part, to significant variations of the polish rate with relatively small changes in the composition of the Ge—Se—Ag films. In some commercial CMP operations, the workpiece is planarized for a fixed period of time. If the polishing rate of a Ge—Se—Ag film varies from one workpiece to the next, planarizing for a fixed period of time could lead to appreciable variations in the thickness of the film removed during the planarization.

Some embodiments of the invention address some or all of these difficulties to provide a practical, commercially viable process for planarizing Ge—Se—Ag films. In particular, smooth, planarized surfaces can be produced without substantial delamination or silver agglomeration by appropriately controlling aspects of the pH, controlling abrasive material in the planarizing medium, and/or limiting the down force against the Ge—Se—Ag film.

As noted above, FIG. 1 illustrates a conventional CMP machine. Embodiments of the invention can be carried out on such a conventional CMP machine. In such embodiments, a microelectronic workpiece having a Ge—Se—Ag film, e.g., the microelectronic workpiece 50 of FIG. 2, is loaded in the carrier assembly 30 of the CMP machine 10, e.g., by attaching the workpiece 50 to the resilient pad 34 of the head 32. The actuator assembly 36 then lowers the head 32 to juxtapose the outer surface 72 of the outer layer 70 (FIG. 2) with the planarizing medium, i.e., the planarizing pad 40 and the liquid planarizing solution 44.

The actuator assembly 36 may also rotate the workpiece 50 and pushes the workpiece 50 against the planarizing medium with a controlled, predetermined down force during the course of the planarizing operation. The actuator assembly may include a controller 37, e.g., a programmed processor, which controls operation of the actuator assembly, including the rotational velocity of the workpiece 50 with respect to the planarizing medium and the down force. Rotating the workpiece 50 at a relative velocity of about 10-100 in. per second should be appropriate, though other rotational speeds may also work. In one embodiment, the down force is relatively low to reduce the likelihood of delaminating the Ge—Se—Ag film from the underlying intermediate layer 60 or substrate surface 56. For certain applications, a down force of no more than about 2 psi is appropriate. In other applications, the down force should be about 0.1-1.9 psi.

The planarizing solution 44 can be delivered from the planarizing solution supply to the planarizing surface 42 of the planarizing pad during the course of planarizing the workpiece. To avoid generating toxic byproducts from the selenium in the Ge—Se—Ag film, the planarizing solution may be basic. Depending on the stoichiometry of the film and other factors, the planarizing solution may range from a mild base to a fairly strong base. For most applications, it is expected that a pH from about 7 to about 11.5 will work well. For example, a pH level of about 8 to about 11.5 is expected to be useful in many applications. Lower pH levels than this will increase the risk of creating toxic byproducts from the selenium. On the other hand, as the pH level increases above this range, it has been found that Ge—Se—Ag chalcogenides become increasingly soluble in the planarizing solution, adversely affecting the integrity of the Ge—Se—Ag film. For films having more silver (e.g., 8-10 atomic % or greater), a planarizing solution with a pH over 11.5 may be employed. For Ge—Se—Ag films with relatively little or no silver (e.g., 0-2 atomic %), planarizing solutions advantageously may have a pH in a lower portion of the stated range, e.g., about 7-10 or about 8-10, though a higher pH may also suffice. In one embodiment, the planarizing solution comprises a base (e.g., potassium hydroxide or tetramethyl ammonium hydroxide) and deionized water in proportions selected to yield the desired pH. While an acidic buffer may be employed to help stabilize pH, planarizing solutions in some embodiments are substantially acid-fee to reduce the chance of generating toxic byproducts from the selenium in the Ge—Se—Ag chalcogenide material.

In other embodiments, the planarizing solution includes ammonia. It is believed that the presence of the ammonia will reduce the rate of selenium hydride production. In one specific formulation, the planarizing solution comprises a combination of potassium hydroxide and ammonia.

As noted above, the planarizing medium of the CMP machine typically includes an abrasive. Fixed-abrasive CMP machines employ a planarizing pad 40 that has abrasive particles imbedded therein. Such fixed-abrasive pads may be a conventional round rotary pad, a web-format pad that can be moved periodically to present a "fresh" abrasive area, or a belt, which is essentially a web-format pad arranged as a continuous loop. In other embodiments, a non-abrasive planarizing pad (e.g., a urethane having a Shore D hardness of about 40-60, commercially available from Rodel as model WWP 3000) is employed and the abrasive particles are included in the planarizing solution 44.

Some abrasives used in conventional CMP operations may be too hard for polishing Ge—Se—Ag films. For example, use of high-purity alumina, which has a Vickers hardness number of 1500 or more, increases the rate at which the outer layer 70 is removed, which could increase throughput. It has been found, however, that such hard abrasives can promote delamination of the Ge—Se—Ag film from the underlying substrate 52 or intermediate layer 60, e.g., by separating the outer layer 70 from the intermediate layer at the interface 62 therebetween. In certain embodiments of the invention, therefore, the abrasive particles are formed of a material having a Vickers hardness of less than about 1500. Silica particles (which typically have Vickers hardness numbers on the order of 1100 or less) have been found to work well and it is anticipated that ceria particles or mixtures of silica and ceria particles may also suffice.

It has also been found that abrasives with larger particle sizes can increase the likelihood of delamination and agglomeration of silver at the surface of the planarized Ge—Se—Ag film. Abrasive particles having a mean particle size of less than about 100 nm are expected to suffice. In one specific application, the mean particle size is about 30-100 nm. In another embodiment, a mean particle size of about 30-50 nm is employed. In one specific system found to work well, silica particles having a mean particle size of about 50 nm were employed. The size distribution of the abrasive particles may be relatively narrow to avoid too many oversized particles.

As noted above, the planarizing solution 44 may provide the abrasive particles used in the planarizing medium. Such a planarizing solution will have a fluid fraction, which may have a pH of about 7 to about 11.5, and a solid fraction comprising the abrasive particles. For example, a pH level of about 8 to about 11.5 is expected to be useful in many applications. Planarizing solutions in which the solid fraction is about 1-30 weight percent are expected to work well. While higher weight percentages of abrasive particles may be functional, this could increase the chances of delamination and/or silver agglomeration.

Figure 3:
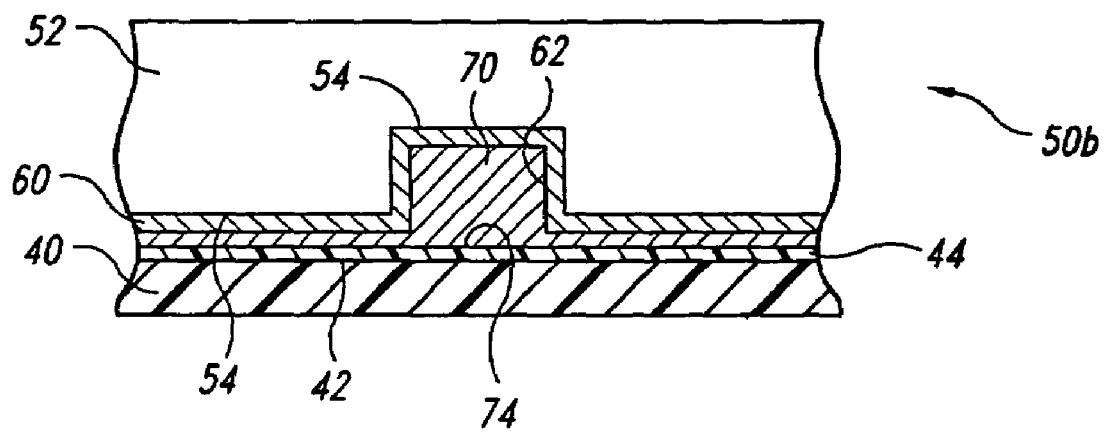
FIG. 3 is a schematic illustration of a stage in the planarization of the microelectronic workpiece shown in FIG. 2.

FIG. 3 schematically illustrates a stage in the process of planarizing the microelectronic workpiece 50 shown in FIG. 2. At this stage, the outer layer 70 of the partially polished workpiece 150 has a polished face 74 which is juxtaposed with the planarizing face 42 of the planarizing pad 40. The planarizing solution 44 is disposed between the polished face 74 of the outer layer and the planarizing face 42 of the planarizing pad 40. The intermediate layer 60 remains beneath the polished face 74 of the outer layer 70 at this stage in the planarizing process.

Figure 4:
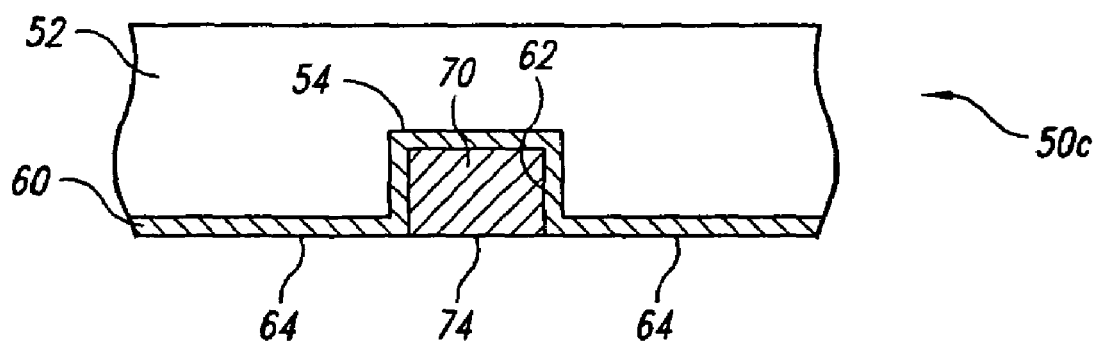
FIG. 4 is a schematic cross-sectional view of the microelectronic workpiece shown in FIG. 2 after planarization.

FIG. 4 schematically illustrates a final planarized microelectronic workpiece 250. At this stage, the entire overburden of the Ge—Se—Ag outer layer 70 is removed, exposing a portion of the intermediate layer 60. In the illustrated embodiment, a portion of the intermediate layer 60 in the recess 54 of the substrate 52 remains covered by the remainder of the outer layer 70. In one embodiment of the invention, the intermediate layer 60 serves as a polish stop, helping automatically detect the end point of the planarizing process. In such an embodiment, the intermediate layer has a removal rate under the planarizing conditions of the CMP machine 10 that is slower than the removal rate of the Ge—Se—Ag film 70. This can be accomplished by employing a material that is less subject to chemical attack by the basic planarizing solution 44 than is the Ge—Se—Ag film 70 and/or which is harder than the Ge—Se—Ag film. In one particular application, the intermediate layer 60 may comprise silicon nitride, which is both harder and more resistant to chemical attack than the adjacent Ge—Se—Ag film 70. Once the overburden of the outer layer 70 is removed and the polishing medium begins to act on the intermediate layer 60, the friction between the polishing medium and the workpiece 50 will change. As a consequence, the force necessary to drive the polishing pad at a constant speed will change. This will cause a change in power to the drive assembly 26, which can be detected as an indication that the polishing is complete. If the actuator assembly 36 includes a controller 37, as noted above, the controller 37 could be programmed to detect this change in friction and either set a flag signifying that polishing is complete or stop rubbing of the workpiece 50 against the polishing medium.

Alternatively, the end point of the polishing process may be determined optically. Light reflected by the Ge—Se—Ag film 70 may differ in color and/or intensity from the light reflected by the intermediate layer 60 from the same light source. A controller 37 may be coupled to an optical sensor in a known manner to detect the change in reflectance and either set an endpoint flag or stop polishing the workpiece 50.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A method of controlled material removal from a microelectronic workpiece which includes a substrate having a surface, an outer layer defining an unpolished face of the workpiece, and an intermediate layer disposed between the substrate surface and the outer layer, the outer layer comprising $(Ge_xSE_y)_aAg_b$, wherein x is about 20-80, y is about 20-80, a is about 90-100, and b is about 0-10, the method comprising:

delivering a process solution to a process surface of a processing pad, the process solution and the processing pad comprising a removal medium, the process solution comprising a fluid component having a pH of about 8-11.5, the removal medium including an abrasive comprising abrasive particles having a mean particle size of about 30-100 nm and a Vickers hardness number of less than about 1500; and removing material of the outer layer by pressing the unpolished face of the workpiece against the polishing medium with a down force of at least about 0.1 psi and no more than about 2 psi.

2. The method of claim 1 wherein the abrasive is delivered to the processing pad as a solid component of the process solution, the solid component comprising about 1-30 weight percent of the process solution.

3. The method of claim 1 wherein the fluid component of the process solution comprises at least one of potassium hydroxide and tetramethyl ammonium hydroxide.

4. The method of claim 1 wherein the intermediate layer comprises a material having a hardness greater than a hardness of the outer layer, wherein the intermediate layer acts as a polish stop.

5. The method of claim 1 wherein the intermediate layer comprises a material having a removal rate slower than a removal rate of the outer layer at the same down force in contact with the same removal medium, wherein the intermediate layer acts as a polish stop.

6. The method of claim 1 wherein the abrasive particles, the down force and a polishing linear velocity are selected to remove the material of the outer layer without substantial delamination of the outer layer from the intermediate layer or the substrate.

7. The method of claim 1 wherein the abrasive is delivered to the processing pad as a solid component of the process solution, the abrasive having a mean particle size of about 30-50 nm.

8. The method of claim 7 wherein the solid component comprises about 1-30 weight percent of the process solution.

9. The method of claim 1 wherein the abrasive particles comprise silica or ceria particles.

10. The method of claim 9 wherein the abrasive particles comprise silica and ceria particles.

11. A method of controlled material removal from a microelectronic workpiece which includes a substrate having a surface, an outer layer defining an unpolished face of the workpiece, and an intermediate layer disposed between the substrate surface and the outer layer, the outer layer comprising $(Ge_xSE_y)_aAg_b$, wherein x is about 20-80, y is about 20-80, a is about 90-100, and b is about 0-10, the method comprising:

delivering a process solution to a process surface of a processing pad, the process solution and the processing pad comprising a removal medium, the process solution having a pH greater than 7, the removal medium including abrasive particles having a mean particle size of no greater than about 100 nm; and removing material of the outer layer by pressing the unpolished face of the workpiece against the polishing medium with a down force of no greater than about 2 psi.

12. The method of claim 11 wherein the abrasive particles, the down force and a polishing linear velocity are selected to remove the material of the outer layer without substantial delamination of the outer layer from the intermediate layer or the substrate.

13. The method of claim 11 wherein the abrasive particles, the down force and a polishing linear velocity are selected to remove the material of the outer layer without substantial agglomeration of silver on a polished surface of the outer layer.

14. A method of removing material from a microelectronic workpiece, comprising:

loading the microelectronic workpiece into a carrier assembly of a CMP machine, the microelectronic workpiece comprising a substrate including an outer layer comprising germanium and selenium and an intermediate layer between the outer layer and the substrate;

delivering a process solution to a processing pad, the process solution and processing pad comprising a removal medium, the process solution comprising a fluid component having a pH of about 8-11.5 and a solid component comprising abrasive particles;

at least partially exposing the intermediate layer by removing material of the outer layer from the workpiece by rubbing the outer layer against the removal medium with a force; and reducing a likelihood of delaminating the outer layer from the intermediate layer by controlling the force of rubbing the outer layer against the removal medium, wherein the outer layer includes up to 10 atomic percent silver, and the abrasive particles, the controlled force and a polishing linear velocity are selected to remove the material of the outer layer without substantial agglomeration of silver on a polished surface of the outer layer.

15. The method of claim 14 wherein the material of the outer layer is removed by rubbing without substantial delamination of the outer layer.

16. The method of claim 14 wherein the solid component comprises about 1-30 weight percent of the process solution delivered to the processing pad.

17. The method of claim 14 wherein the abrasive particles comprise silica or ceria particles.

18. The method of claim 14 wherein the controlled force is no greater than 2 psi.

19. The method of claim 14 wherein the controlled force is about 0.1-2 psi.

20. The method of claim 14 wherein the intermediate layer comprises a material having a removal rate slower than a removal rate of the outer layer, the intermediate layer acting as a polish stop.

21. The method of claim 14 wherein the abrasive particles of the process solution delivered to the processing pad have a mean particle size of about 30-50 nm.

22. The method of claim 21 wherein the solid component comprises about 1-30 weight percent of the process solution.

23. A method of removing material from a microelectronic workpiece, comprising:

loading the microelectronic workpiece into a carrier assembly of a CMP machine, the microelectronic workpiece comprising a substrate including an outer layer comprising germanium and selenium and an intermediate layer between the outer layer and the substrate;

delivering a process solution to a processing pad, the process solution and processing pad comprising a removal medium, the process solution comprising a fluid component having a pH of at least about 8 and a solid component comprising abrasive particles having a particle size of about 30-100 nm;

at least partially exposing the intermediate layer by removing material of the outer layer from the workpiece by rubbing the outer layer against the removal medium with a force; and reducing a likelihood of delaminating the outer layer from the intermediate layer by controlling the force of rubbing the outer layer against the removal medium, wherein the outer layer includes up to 10 atomic percent silver, and the abrasive particles, the controlled force and a polishing linear velocity are selected to remove the material of the outer layer without substantial agglomeration of silver on a polished surface of the outer layer.

24. The method of claim 23 wherein the material of the outer layer is removed by rubbing without substantial delamination of the outer layer.

25. The method of claim 23 wherein the solid component comprises about 1-30 weight percent of the process solution delivered to the processing pad.

26. The method of claim 23 wherein the abrasive particles of the process solution delivered to the processing pad have a mean particle size of about 30-50 nm.

27. The method of claim 23 wherein the abrasive particles comprise silica or ceria particles.

28. The method of claim 23 wherein the controlled force is no greater than 2 psi.

29. The method of claim 23 wherein the fluid component has a pH no greater than about 11.5.

30. The method of claim 29 wherein the intermediate layer comprises a material having a removal rate slower than a removal rate of the outer layer, the intermediate layer acting as a polish stop.

31. A method of controlled material removal from a microelectronic workpiece, comprising:
loading the microelectronic workpiece into a carrier assembly of a CMP machine, the microelectronic workpiece comprising a substrate including an outer layer comprising germanium and selenium and an intermediate layer between the outer layer and the substrate;
delivering a process solution to a processing pad, the process solution and processing pad comprising a removal medium, the process solution comprising a fluid component having a pH of at least about 8 and a solid component comprising abrasive particles;
at least partially exposing the intermediate layer by removing material of the outer layer from the workpiece by rubbing the outer layer against the removal medium; and
reducing a likelihood of delaminating the outer layer from the intermediate layer by controlling the force of rubbing the outer layer against the removal medium to be about 0.1-2 psi, wherein the outer layer includes up to 10 atomic percent silver, and the abrasive particles, the controlled force and a polishing linear velocity are selected to remove the material of the outer layer without substantial agglomeration of silver on a polished surface of the outer layer.

32. The method of claim 31 wherein the material of the outer layer is removed by rubbing without substantial delamination of the outer layer.

33. The method of claim 31 wherein the solid component comprises about 1-30 weight percent of the process solution delivered to the processing pad.

34. The method of claim 31 wherein the abrasive particles comprise silica or ceria particles.

35. The method of claim 31 wherein the intermediate layer comprises a material having a removal rate slower than a removal rate of the outer layer, the intermediate layer acting as a polish stop.

36. The method of claim 31 wherein the abrasive particles of the process solution delivered to the processing pad have a mean particle size of about 30-50 nm.

37. The method of claim 36 wherein the solid component comprises about 1-30 weight percent of the process solution.

* * * * *

UNITED STATES PATENT AND TRADEMARK OFFICE
CERTIFICATE OF CORRECTION

PATENT NO. : 7,381,647 B2  Page 1 of 1
APPLICATION NO. : 11/112787
DATED : June 3, 2008
INVENTOR(S) : Chandrasekaran et al.

It is certified that error appears in the above-identified patent and that said Letters Patent is hereby corrected as shown below:

On the Title page, Item (54), in "Title", delete "GE-SE-AG" and insert -- Ge-Se-Ag --, therefor.

In column 1, line 3, delete "GE-SE-AG" and insert -- Ge-Se-Ag --, therefor.

In column 8, line 62, in Claim 1, delete $(Ge_x-SE_y)$" and insert -- $(Ge_x-Se_y)$ --, therefor.

In column 9, line 48, in Claim 11, delete "$(Ge_x-SE_y)$" and insert -- $(Ge_x-Se_y)$ --, therefor.

Signed and Sealed this

Twelfth Day of August, 2008

JON W. DUDAS
*Director of the United States Patent and Trademark Office*